US008716855B2

(12) United States Patent
Chi et al.

(10) Patent No.: US 8,716,855 B2
(45) Date of Patent: May 6, 2014

(54) INTEGRATED CIRCUIT SYSTEM WITH DISTRIBUTED POWER SUPPLY COMPRISING INTERPOSER AND VOLTAGE REGULATOR MODULE

(75) Inventors: Shyh-An Chi, Hsinchu (TW); Mark Shane Peng, Hsinchu (TW); Yun-Han Lee, Baoshan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 116 days.

(21) Appl. No.: 12/943,395

(22) Filed: Nov. 10, 2010

(65) Prior Publication Data

US 2012/0112352 A1    May 10, 2012

(51) Int. Cl.
*H01L 23/52* (2006.01)

(52) U.S. Cl.
USPC ........... 257/691; 257/713; 257/773; 257/786; 257/686; 257/E23.079

(58) Field of Classification Search
None
See application file for complete search history.

(56) References Cited

U.S. PATENT DOCUMENTS

| | | | |
|---|---|---|---|
| 5,698,895 A * | 12/1997 | Pedersen et al. | 257/665 |
| 7,737,740 B2 * | 6/2010 | Millar et al. | 327/141 |
| 2003/0081389 A1 | 5/2003 | Nair et al. | |
| 2005/0051889 A1 * | 3/2005 | Wood et al. | 257/712 |
| 2006/0071648 A1 | 4/2006 | Narendra et al. | |
| 2006/0071650 A1 * | 4/2006 | Narendra et al. | 323/285 |
| 2006/0133040 A1 * | 6/2006 | Belady et al. | 361/704 |
| 2006/0133041 A1 * | 6/2006 | Belady et al. | 361/704 |
| 2010/0002398 A1 | 1/2010 | Braunisch et al. | |
| 2011/0042795 A1 * | 2/2011 | Knickerbocker | 257/686 |

OTHER PUBLICATIONS

Liu, Yongpan et al., "Thermal vs Energy Optimization for DVFS-enabled Processors in Embedded Systems", Proceedings of the 8th International Symposium on Quality Electronic Design (ISQED'07).

* cited by examiner

*Primary Examiner* — Marcos D. Pizarro
*Assistant Examiner* — Cesar Lopez
(74) *Attorney, Agent, or Firm* — Lowe Hauptman & Ham, LLP

(57) ABSTRACT

An integrated circuit system having an interposer and an integrated circuit with first and second bond pads, the integrated circuit die bonded to the interposer using the first bond pads. The integrated circuit having circuit blocks, that operate at different operating voltages and voltage regulator modules die bonded to the second bond pads of the integrated circuit. The voltage regulator modules converting a power supply voltage to the operating voltage of a respective circuit block and supply the respective operating voltage to the circuit block via the second bond pads.

21 Claims, 7 Drawing Sheets

INTEGRATED CIRCUIT SYSTEM WITH DISTRIBUTED POWER SUPPLY COMPRISING INTERPOSER AND VOLTAGE REGULATOR MODULE

BACKGROUND

Many integrated circuits have multiple circuit blocks that operate at different frequencies and voltages from one another. The different frequencies and voltages allow the frequency and voltage of each circuit block to be optimized for that circuit block. Further, many integrated circuits have circuit blocks powered by dynamic voltage and frequency scaling (DVFS) in which the frequency of operation and voltage of operation of the circuit block is continuously modified to suit the current operations performed by the circuit block.

To supply the voltages to the various circuit block a separate voltage regulator module (VRM) corresponding to each circuit block is used. Due to the power dissipated, and the technology used to fabricate the VRMs, the VRMs are usually not fabricated as a circuit block on the integrated circuit that the VRMs power. The VRMs are fabricated as separate integrated circuits, and the power is delivered by an electrical wiring connection between the VRM and the integrated circuit. If the electrical wiring connection is long, ohmic resistance based voltage drops cause power losses proportional to the resistance and the square of the current. Thus, the long wiring causes the circuit block to receive a low voltage and energy is wasted in the wiring.

Furthermore, if the current supplied to the circuit block is changing with time, the inductance of the electrical wiring connection causes a significant voltage drop proportional to the rate of change of current and the inductance. As the electrical wiring connection becomes longer, both the ohmic resistance and the inductance of the electrical wiring connection become higher. Therefore, the VRM is positioned as close as possible to the circuit block of the integrated circuit driven by the VRM.

Positioning the VRM close to the integrated circuit causes noise to be induced in the integrated circuit because of the proximity of wiring that supplies the VRM with power. Therefore, as the VRM is positioned closer to the integrated circuit consideration must be given to the route that the supply wiring takes to reach the VRM.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
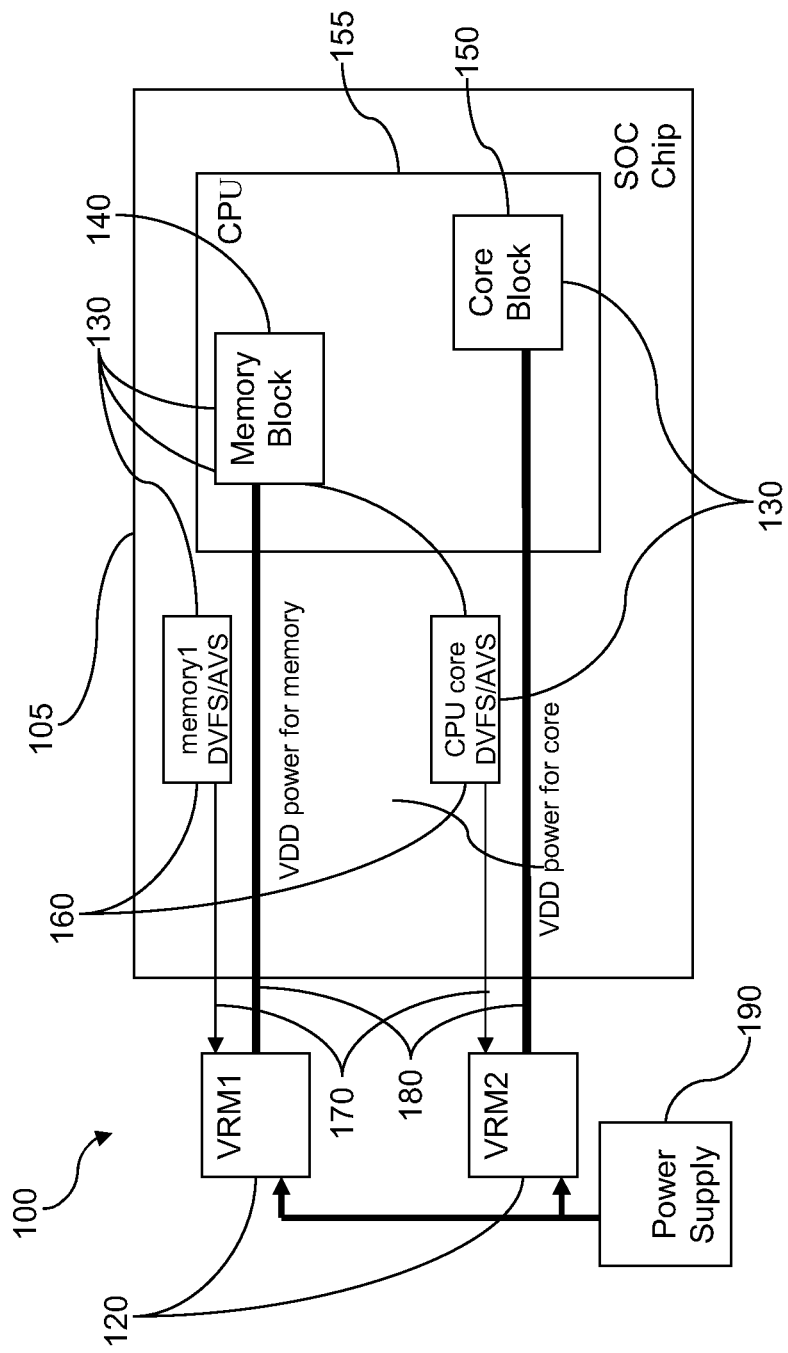
FIG. 1 is a high-level functional schematic diagram of an integrated circuit system with distributed power supply according to an embodiment.

FIG. 1 is a high-level functional schematic diagram of an integrated circuit system with a distributed power supply 100 according to an embodiment. The integrated circuit system 100 comprises an integrated circuit 105, two VRMs 120 and a power supply 190. In FIG. 1 the integrated circuit 105 is a system on chip (SOC) integrated circuit which means that integrated circuit 105 comprises many circuit blocks 130 integrated on a single chip. These components include a memory block 140 and a core block 150 of a central processing unit (CPU) 155 as well as dynamic voltage frequency scaling/automatic voltage scaling DVFS/AVS circuits 160.

The memory block 140 and the core block 150 are supplied with separate voltages supplied from respective VRMs 120. Thus, memory block 140 receives a different voltage compared with core block 150. The voltage supplies for memory block 140 and the core block 150 are adjusted separately by the respective DVFS/AVS circuits 160 to match the present requirement of the memory block 140 and the core block 150. If the memory block 140 or the core block 150 is processing data quickly, the voltage supply is increased so that the memory block or core block executes faster. If the memory block 140 or the core block 150 is idle, the voltage supply is reduced so that the memory block or the core block executes slower and uses less power. The respective DVFS/AVS circuits 160 control the voltages supplied to the memory block 140 or the core block 150 by the respective VRMs 120 via control connections 170 between the integrated circuit 105 and the VRMs 120. The respective VRMs 120 supply the controlled voltages to the memory block 140 or the core block 150 via supply connections 180 between the integrated circuit 105 and the VRMs.

This disclosure is not limited to SOC integrated circuit chips and, in various embodiments, the integrated circuit is any other known or future integrated circuit usable in connection with one or more embodiments of the present disclosure.

Further, this disclosure is not limited to the circuit blocks of FIG. 1 and, in various embodiments, the circuit blocks are any other known or future circuit blocks usable in connection with one or more embodiments of the present disclosure. Moreover, this disclosure is not limited to the combination of circuit blocks, VRMs and DVFS/AVS circuits of FIG. 1 and, in various embodiments, the combination and number of circuit blocks, VRMs and DVFS/AVS circuits is any combination or number usable in connection with one or more embodiments of the present disclosure.

Figure 2:
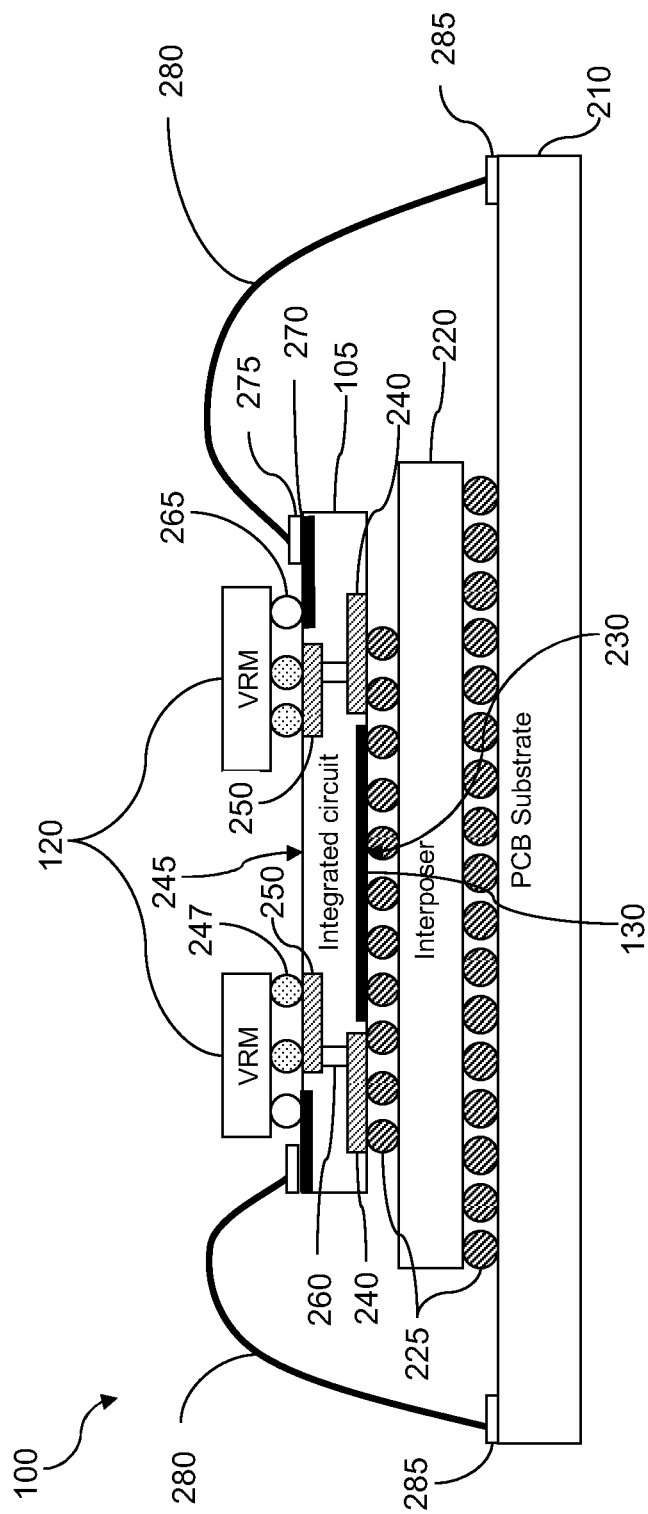
FIG. 2 is a cross section diagram of an integrated circuit system with distributed power supply according to the embodiment of FIG. 1.

FIG. 2 is a diagram of a cross section view of an integrated circuit system 100 according to the embodiment in FIG. 1. A printed circuit board (PCB) substrate 210 forms the base of the integrated circuit system 100. An interposer 220 is bonded to the PCB substrate 210 by bonds 225. The interposer 220 is used to adapt the positions of bonds on the PCB substrate 210 to the position of bonds on integrated circuits attached to the interposer 220, relieve stress due to different coefficients of expansion between the PCB substrate 210 and attached integrated circuits and electrically connect together attached integrated circuits. A front surface 230 of the integrated circuit 105 is die bonded to the interposer 220 by bonds 225 using a first set of bond pads 240 of the integrated circuit 105. The VRMs 120 are die bonded to a back surface 245, opposite the front surface 230, of the integrated circuit 105. Specifically, the VRMs 120 are bonded via bonds 247 to a second set of bond pads 250. The second set of bond pads 250 and the bonds 247 form a portion of the control connections 170 (FIG. 1) and supply connections 180 (FIG. 1). Through silicon vias (TSV) and metal layers 260 also form a portion of the control connections 170 and supply connections 180 by connecting the bond pads 250 to the circuit blocks 130 formed on the front surface 230 of the integrated circuit 105. In other embodiments, the circuit blocks 130 are formed on the back surface 245, between the front surface 230 and the back surface or any combination of the above.

The VRMs 120 connect to the power supply 190 (FIG. 1) via the bonds 265 and a redistribution layer or metal layer 270 formed on the integrated circuit 105. The redistribution layer or metal layer 270 is electrically connected to first wire bond pad 275 formed on the integrated circuit 105. The first wire bond pad 275 is wire bonded by a wire bond 280 to a second wire bond pad 285 formed on the PCB substrate 210. The second wire bond pad 285 is electrically connected to power supply 190. Thus, the connection between the VRMs 120 and the power supply 190 is not via the interposer 220.

Figure 3:
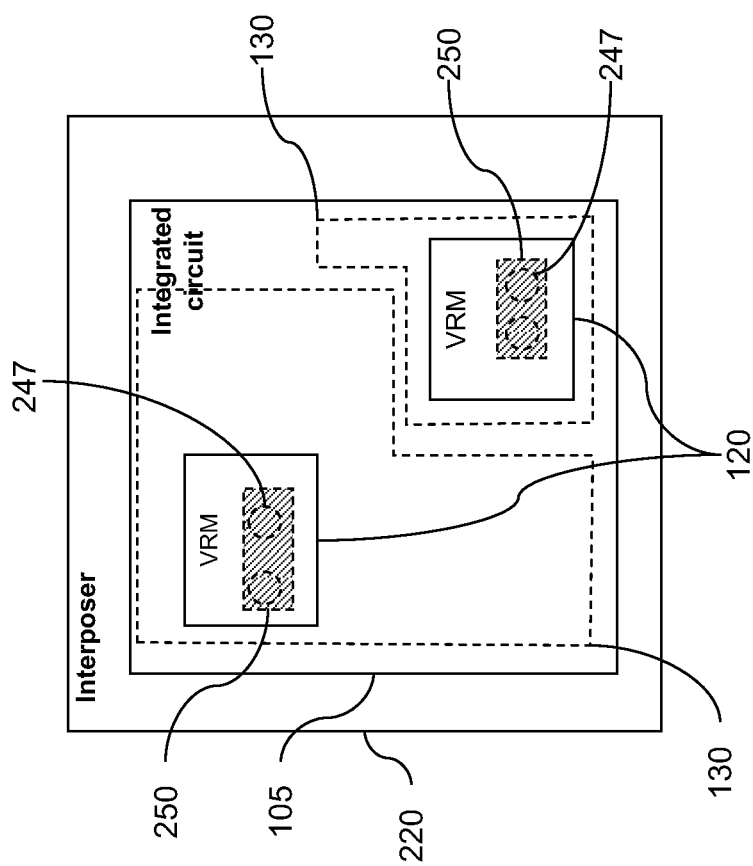
FIG. 3 is a diagram of a top view of the integrated circuit system with distributed power supply according to the embodiment of FIG. 2.

FIG. 3 is a diagram of a top view of an integrated circuit system 100 according to the embodiment in FIG. 1. The PCB substrate 210 and the bonds between the PCB substrate 210 and the interposer 220, the power supply bond 265, power supply wiring 270, first power supply wire 275, power supply wire bond 280, second power supply wire 285 are not shown in FIG. 3.

The VRMs 120 are bonded to the integrated circuit at the second set of bond pads 250 formed in an area of the first integrated circuit that corresponds to the respective one of the at least two circuit blocks 130. In this manner the length of the control connections 170 and supply connections 180 between the VRMs 120 and the respective circuit blocks 130 (FIG. 1) are minimized.

This disclosure is not limited to the number and position of VRMs of FIGS. 2 and 3 and, in various embodiments, the number and position of VRMs is any number or position usable in connection with one or more embodiments of the present disclosure.

Figure 4:
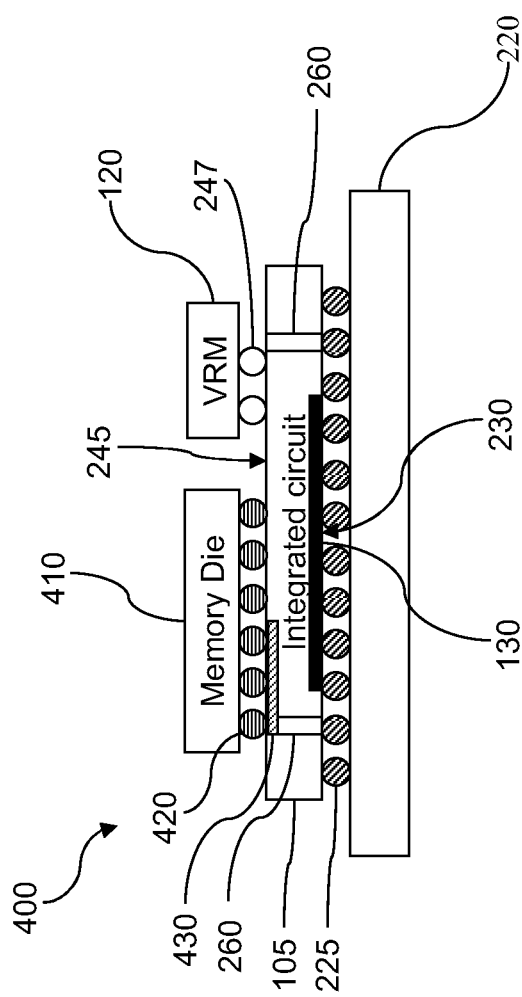
FIG. 4 is a cross section diagram of an integrated circuit system with distributed power supply according to an embodiment.

FIG. 4 is a diagram of a cross section view of an integrated circuit system 400 according to an embodiment. Integrated circuit system 400 is similar to integrated circuit system 100 but comprises a single VRM 120. The PCB substrate 210 and the bonds between the PCB substrate 210 and the interposer 220, the power supply bond 265, power supply wiring 270, first power supply wire 275, power supply wire bond 280, second power supply wire 285 and bond pad 240 are not shown in FIG. 4. These features are arranged in a similar manner to that in the integrated circuit system 100.

The integrated circuit system 400 further comprises a memory die 410 die bonded to the back surface 245 of the integrated circuit 105. The memory die 410 is die bonded to the integrated circuit 105 by bonds 420 and bond pads 430. The bond pads 430 and bonds 420 electrically connect the memory die 410 to one or more circuit blocks 130 of integrated circuit 230 via TSVs and metal layers 260. The bond pads 430, bonds 420, TSVs and metal layers 260 are positioned to minimize the length of the electrical connections to the circuit blocks 130. In some embodiments, the memory die 410 is an integrated circuit with a function other than memory. The function of an integrated circuit 410 is any other known or future function usable in connection with one or more embodiments of the present disclosure. In some embodiments, the circuit blocks 130 are formed on the back surface 230 as in FIG. 4. In other embodiments, the circuit blocks 130 are formed on the back surface 245, between the front surface 230 and the back surface or any combination of the above.

Figure 5:
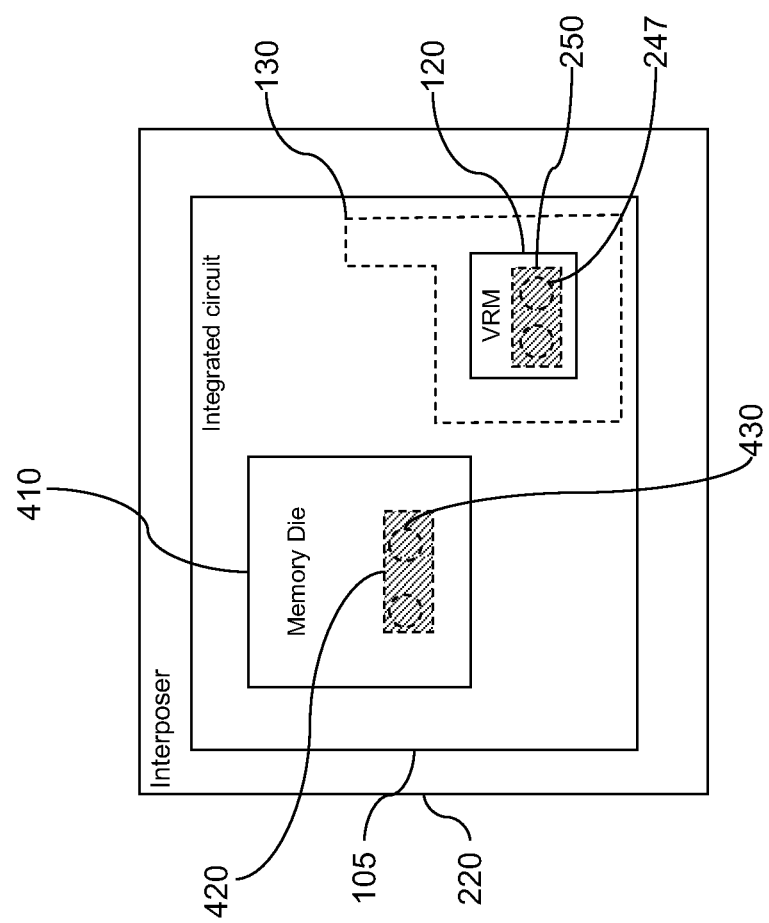
FIG. 5 is a diagram of a top view of the integrated circuit system with distributed power supply according to the embodiment of FIG. 4.

FIG. 5 is a diagram of a top view of the integrated circuit system 400 according to the embodiment of FIG. 4. The VRM 120 is positioned on the back surface of the integrated circuit 245 (FIG. 4) at an area that corresponds to the circuit block 130 the VRM 120 supplies with power. The memory die 410 is positioned on the back surface of the integrated circuit 245 (FIG. 4) at an area that corresponds to the circuit blocks 130 with which the memory die 410 communicates.

This disclosure is not limited to the number and position of VRMs and second integrated circuit of FIGS. 4 and 5 and, in various embodiments, the number and position of VRMs second integrated circuits is any number or position usable in connection with one or more embodiments of the present disclosure.

Figure 6:
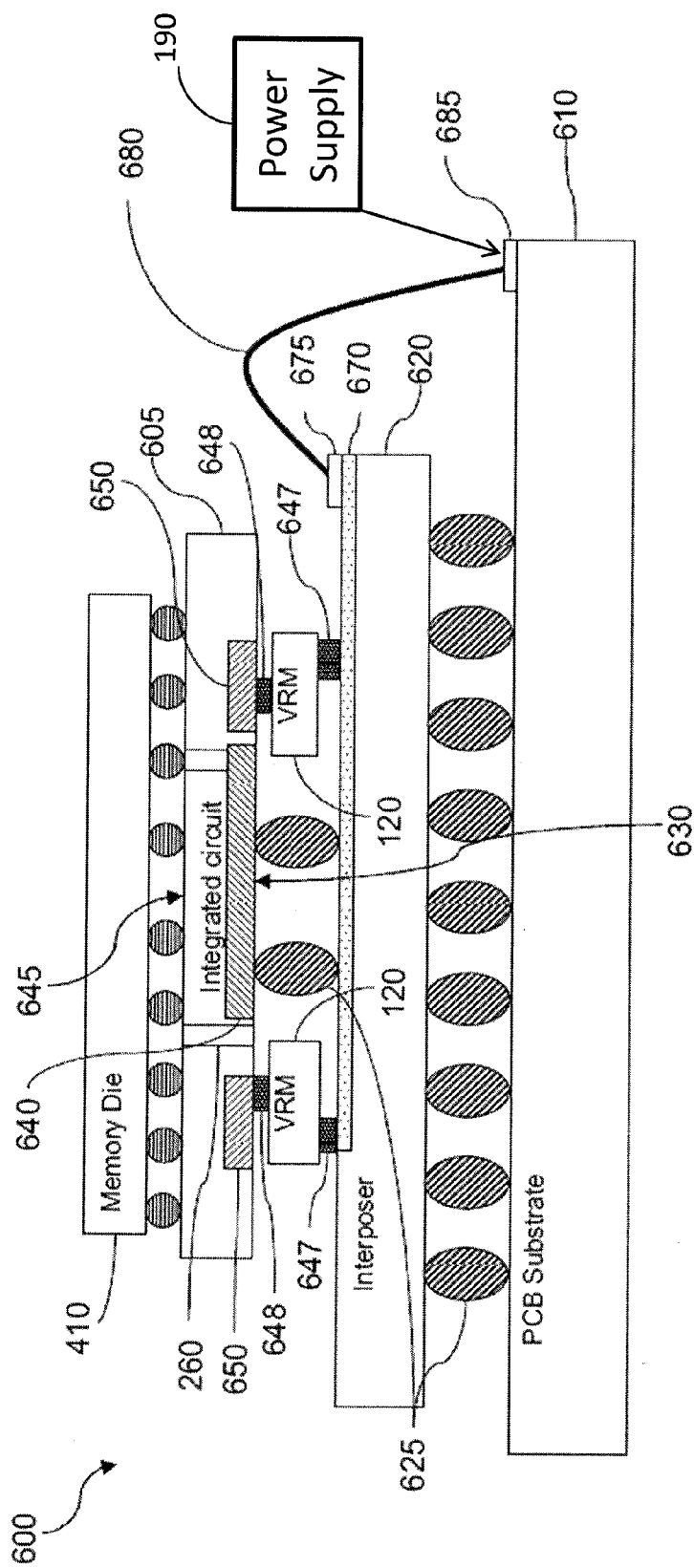
FIG. 6 is a cross section diagram of an integrated circuit system with distributed power supply according to an embodiment.

FIG. 6 is a diagram of a cross section view of an integrated circuit system 600 according to an embodiment. The embodiment of FIG. 6 is a different implementation of the embodiment of FIG. 1, the integrated circuit 105 replaced by a different integrated circuit 605 having similar features. The embodiment of FIG. 6 differs from the embodiment of FIG. 2 because the VRMs 120 are placed between the interposer and the integrated circuit, and the power supply connection to the VRMs is made via the interposer rather than the integrated circuit.

A PCB substrate 610 forms the base of the integrated circuit system 600. An interposer 620 is bonded to the PCB substrate 610 by bonds 625. A front surface 630 of an integrated circuit 605 is die bonded to the interposer 620 by bonds 625 using a first set of bond pads 640 of the integrated circuit 605. The integrated circuit 605 is similar to integrated circuit 105 of FIG. 1 comprising circuit blocks 130. The VRMs 120 are disposed between the integrated circuit 605 and the interposer 620 and die bonded to the front surface 630 of the integrated circuit and to the interposer via bonds 647 and bonds 648. The bonds 648 between VRMs 120 and the integrated circuit 605 are formed to a second set of bond pads 650 and the bonds 648 form a portion of the control connections 170 (FIG. 1) and supply connections 180 (FIG. 1).

The VRMs 120 connect to the power supply 190 (FIG. 1) via the power supply bonds 647 and a redistribution layer or metal layer 670 on the interposer 620. The redistribution layer or metal layer 670 formed on the interposer 620 is electrically connected to first wire bond pad 675 formed on the interposer. The first wire bond pad 675 is wired bonded to a second wire bond pad 685 formed on the PCB substrate 610 by wire bond 680. The second wire bond pad 685 is electrically connected to power supply 190. Thus, the connection between the VRMs 120 and the power supply 190 is not via the bonds 625 between interposer 620 and the PCB substrate 610.

The memory die 410 of FIG. 4 is bonded on a backside 645 of the integrated circuit 605. TSV's and metal layers 260 form electrical connections between the memory die 410 and the circuit blocks 130 of the integrated circuit 605. In some embodiments, the circuit blocks 130 (not shown in FIG. 6) are formed on the back surface 630. In other embodiments, the circuit blocks 130 are formed on the back surface 645, between the front surface 630 and the back surface or any combination of the above.

Figure 7:
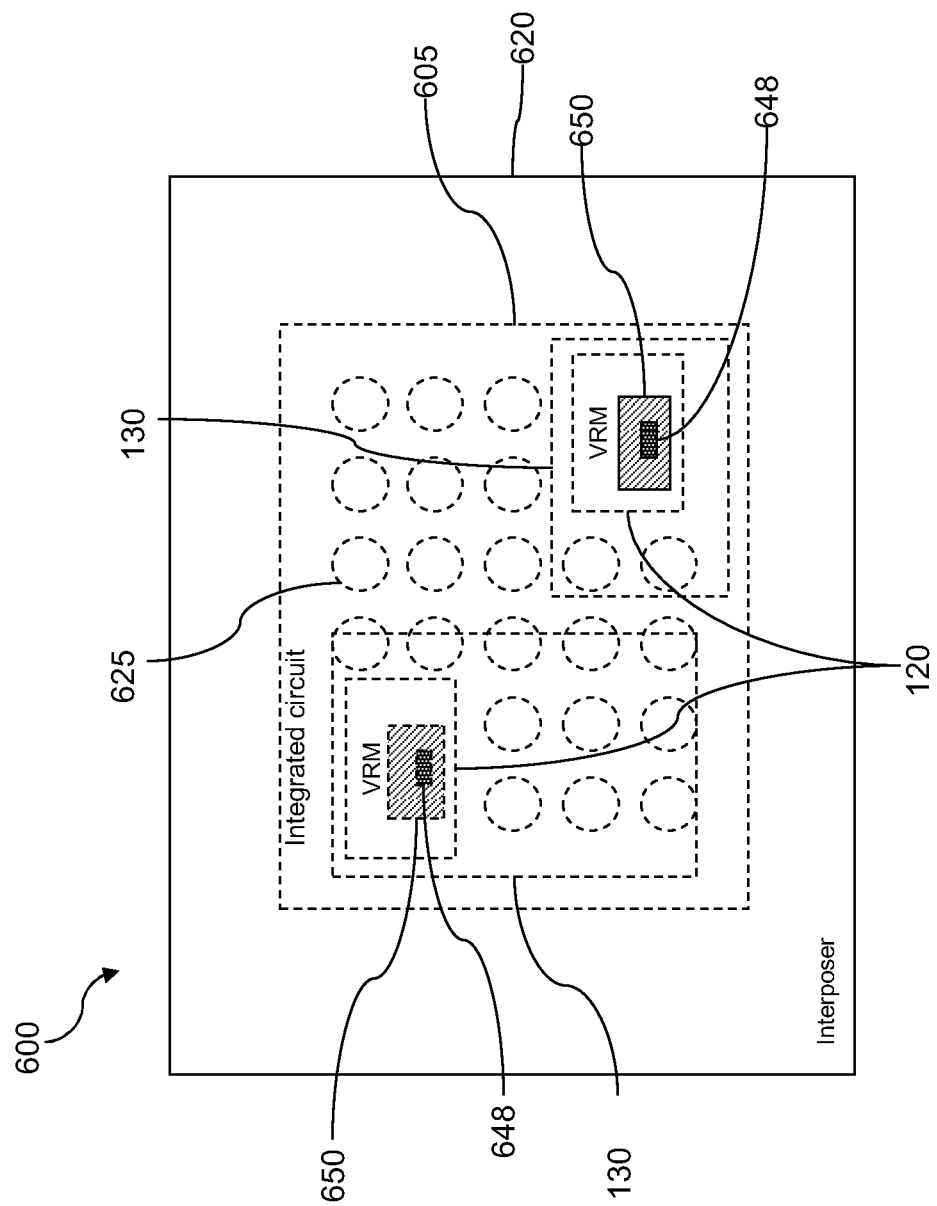
FIG. 7 is a diagram of a bottom view of the integrated circuit system with distributed power supply according to the embodiment of FIG. 6.

FIG. 7 is a diagram of a bottom view of the integrated circuit system 600. The PCB substrate 610 and the bonds between the PCB substrate 610 and the interposer 620, the power supply bonds 647, power supply wiring 670, first wire bond pad 675, wire bond pad 680, second wire bond pad 685 and the memory die 410 are not shown in FIG. 7. The VRMs 120 are bonded to the integrated circuit at the second set of bond pads 650 formed in an area of the first integrated circuit that corresponds to the respective one of the at least two circuit blocks 130. In this manner, the length of the control connections 170 and supply connections 180 between the VRMs 120 and the respective circuit blocks 130 are minimized. The VRMs 120 are also positioned between bonds 625.

This disclosure is not limited to the number and position of VRMs of FIGS. 6 and 7 and, in various embodiments, the number and position of VRMs is any number or position usable in connection with one or more embodiments of the present disclosure.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit system comprising:
   an interposer;
   a first integrated circuit comprising:
      first bond pads, the first integrated circuit die bonded to the interposer on a front surface of the first integrated circuit at a first position of the interposer using the first bond pads;
      second bond pads; and
      at least two circuit blocks, at least two of the circuit blocks adapted to operate at different operating voltages; and
   at least one voltage regulator module die bonded to the second bond pads on the front surface of the first integrated circuit, the at least one voltage regulator module adapted to convert a received power supply voltage to the respective operating voltage of a respective one of the at least two circuit blocks and supply the respective operating voltage via the second bond pads, the at least one voltage regulator module being separate from the interposer, and die bonded to the interposer at a second position of the interposer different from the first position,
   wherein the at least one voltage regulator module is connected between the first integrated circuit and the interposer.

2. The integrated circuit system according to claim 1, the first integrated circuit further comprising a dynamic voltage and frequency scaling controller connected to and adapted to control the at least one voltage regulator module.

3. The integrated circuit system according to claim 1, further comprising a second integrated circuit die bonded to a back surface of the first integrated circuit, the back surface being opposite to the front surface of the first integrated circuit.

4. The integrated circuit system according to claim 3, further comprising at least one of a through silicon via or a metal layer, electrically connecting the respective one of the at least two circuit blocks to the second integrated circuit.

5. The integrated circuit system according to claim 1, the second bond pads electrically connected to the respective one of the at least two circuit blocks, the respective one of the at least two circuit blocks on the front surface of the first integrated circuit.

6. The integrated circuit system according to claim 1, the second bond pads formed in an area of the first integrated circuit that corresponds to the respective one of the at least two circuit blocks.

7. The integrated circuit system according to claim 1, the interposer further comprising at least one supply bond pad that is electrically connected to the at least one voltage regulator module.

8. The integrated circuit system according to claim 7, the interposer further comprising at least one of a redistribution layer or metal layer electrically connecting the at least one supply bond pad to the at least one voltage regulator module.

9. The integrated circuit system according to claim 8, further comprising a wire bond pad electrically connecting the at least one of the redistribution layer and the metal layer to a power supply configured to supply the power supply voltage.

10. The integrated circuit system according to claim 1, the at least one voltage regulator module die bonded to the second bond pads on a back surface of the first integrated circuit, a front surface of the first integrated circuit opposite the back surface and die bonded to the interposer.

11. The integrated circuit system according to claim 10, further comprising a second integrated circuit die bonded to the back surface of the first integrated circuit.

12. The integrated circuit system according to claim 10, further comprising at least one supply bond pad electrically connecting the at least one voltage regulator module to a power supply that supplies the power supply voltage.

13. The integrated circuit system according to claim 12, the first integrated circuit further comprising at least one of a redistribution layer or metal layer electrically connecting the at least one supply bond pad to the power supply.

14. The integrated circuit system according to claim 13, further comprising a wire bond pad electrically connecting the at least one of the redistribution layer and the metal layer to the power supply.

15. The integrated circuit system according to claim 10, the second bond pads electrically connected to the respective circuit block using at least of a through silicon via or a metal layer.

16. A chip package comprising:
   a substrate comprising first bond pads;
   an interposer comprising second bond pads, the interposer die bonded to the first bond pads;
   a first integrated circuit comprising:
      a planar surface, the first integrated circuit die bonded to the second bond pads by the planar surface;
      third bond pads on the planar surface; and
      at least two circuit blocks, at least two of the circuit blocks adapted to operate at different operating voltages;
   at least one voltage regulator, the at least one voltage regulator module die bonded to the third bond pads, the at least one voltage regulator module adapted to supply a respective one of the at least two circuit blocks with the respective operating voltage via the third bond pads, the at least one voltage regulator being separate from the interposer; and
   a wire bond, the wire bond adapted to electrically connect the voltage regulator module to a supply bond pad.

17. The integrated circuit system according to claim 16, the interposer further comprising at least one of a redistribution layer or metal layer electrically connecting the at least one supply bond pad to the at least one voltage regulator module.

18. An integrated circuit system comprising:
an interposer;
a first integrated circuit comprising:
- first bond pads, the first integrated circuit die bonded to the interposer on a front surface of the first integrated circuit at a first position of the interposer using the first bond pads;
- second bond pads; and
- at least two circuit blocks, at least two of the circuit blocks adapted to operate at different operating voltages;

at least one voltage regulator module die bonded to the second bond pads on the front surface of the first integrated circuit, the at least one voltage regulator module adapted to convert a received power supply voltage to the respective operating voltage of a respective one of the at least two circuit blocks and supply the respective operating voltage via the second bond pads, the at least one voltage regulator module being separate from the interposer, and die bonded to the interposer at a second position of the interposer different from the first position; and a second integrated circuit die bonded to a back surface of the first integrated circuit, the back surface being opposite to the front surface of the first integrated circuit.

19. The integrated circuit system according to claim 18, further comprising at least one of a through silicon via or a metal layer, electrically connecting the respective one of the at least two circuit blocks to the second integrated circuit.

20. The integrated circuit system according to claim 18, the interposer further comprising at least one of a redistribution layer or metal layer electrically connecting the at least one supply bond pad to the at least one voltage regulator module.

21. An integrated circuit system comprising:
an interposer;
a first integrated circuit comprising:
- first bond pads, the first integrated circuit die bonded to the interposer at a first position of the interposer using the first bond pads;
- second bond pads; and
- at least two circuit blocks comprising a first circuit block and a second circuit block, the first circuit block and the second circuit block being adapted to operate at different operating voltages;

at least one voltage regulator module die bonded to the second bond pads, the at least one voltage regulator module adapted to convert a received power supply voltage to the respective operating voltage of the first circuit blocks and supply the respective operating voltage via the second bond pads, the at least one voltage regulator module being separate from the interposer, and die bonded to the interposer at a second position of the interposer different from the first position, wherein the second bond pads are formed in an area of the first circuit block.

* * * * *